(12) United States Patent
Maxwell

(10) Patent No.: US 6,943,455 B1
(45) Date of Patent: Sep. 13, 2005

(54) PACKAGING SYSTEM FOR POWER SUPPLIES

(75) Inventor: John A. Maxwell, Newbury Park, CA (US)

(73) Assignee: Power-One Limited, (KY)

( * ) Notice: Subject to any disclaimer, the term of this patent is extended or adjusted under 35 U.S.C. 154(b) by 62 days.

(21) Appl. No.: 10/377,225

(22) Filed: Feb. 27, 2003

(51) Int. Cl.[7] .............................................. H01L 21/31
(52) U.S. Cl. ..................................... 257/784; 257/736
(58) Field of Search ............................... 257/522, 735, 257/736, 784

(56) References Cited

U.S. PATENT DOCUMENTS

| | | |
|---|---|---|
| 5,218,231 A | 6/1993 | Kudo |
| 6,521,982 B1 | 2/2003 | Crowley et al. |
| 6,528,880 B1 * | 3/2003 | Planey ........................ 257/735 |
| 6,707,138 B2 * | 3/2004 | Crowley et al. ............ 257/676 |
| 6,747,341 B2 | 6/2004 | Knapp et al. |
| 6,768,188 B2 * | 7/2004 | Moriguchi .................. 257/676 |

* cited by examiner

*Primary Examiner*—S. V. Clark
(74) *Attorney, Agent, or Firm*—O'Melveny & Myers LLP

(57) ABSTRACT

A packaging system for a high current, low voltage power supply. The power supply uses two bare die field effect transistors whose input and output electrodes are solder attached to low resistance, high current posts in the package. An associated controller chip is mounted to a rigid circuit board, and the circuit board is mechanically attached to the posts. The circuit board thereby gives physical rigidity to the package, but carries no high currents. The use of low resistance, high current posts reduces the heat generated, improving the long term reliability.

30 Claims, 7 Drawing Sheets

PACKAGING SYSTEM FOR POWER SUPPLIES

FIELD OF THE INVENTION

The present invention relates to the packaging of integrated circuits and semiconductor devices. More particularly, this invention relates to the packaging of high power field effect transistors or other semiconductor devices for power supplies.

BACKGROUND OF THE INVENTION

With the advent of microprocessors and other electronics that consume more electrical power, comes the need for higher output current power supplies. While microprocessor voltage requirements are decreasing, substantial increases in electric current requirements are offsetting this trend. Future processors may consume current at levels an order of magnitude higher than today's processors, and will dissipate much more power because the operating voltage will not decrease proportionately. GHz class central processing units (CPUs) are routinely specified to draw 30A or more of direct current. Therefore a need has arisen for high current, low voltage power sources which have a small physical size and generate a modest amount of heat. (As is conventional, "power source" or "power supply" refers here to an electrical voltage/current converter, not to the ultimate source of the electricity, such as a battery or generator.)

Furthermore the miniaturization of electronics products has driven the reduction in size of each integrated circuit (IC) or discrete semiconductor such as transistors (e.g., metal-oxide-semiconductor field effect transistors MOS-FETs), and increased packing densities of the ICs or FETs on a circuit board. The amount of heat generated per unit area by the reduced footprint (size) ICs or FETs increases with their packing density. The requirements for packaging (housing) these heat-generating ICs or FETs in ever smaller areas, make the need to provide adequate heat exhaust paths, such as thermal heat sinks more urgent, and this is particularly so for high current devices such as power FETs. The packaging requirements for such power FETs and power supplies are demanding, as they must switch high currents in a small physical size.

However, circuit assembly and packaging technology for power supplies have not kept pace with those of ICs. The state-of-the-art packaged power supplies are in the forms of single-in-line package (SIP), dual-in-line package (DIP), small outline package (SO or SOP) and quad flat pack (QFP), which have undesirably large size, high resistance and parasitic capacitance, poor thermal management and high cost. Inside these power supplies, electrical interconnection of the power switching devices such as field effect transistors (FETs) is accomplished with wire bonds onto printed circuit boards. Such wire bonds are prone to resistance, noise, parasitic capacitance and inductance, fatigue and eventual failure. One of the main failure mechanisms is thermal cycling which induces wire bond "lift off", because of the large thermal expansion coefficient mismatch between the typically aluminum wires and silicon die of the FETs.

The use of printed circuit boards (PCBs) in power supplies also has drawbacks, because the conductive traces on the PCBs are etched, deposited or otherwise attached thin films on the laminated substrate. PCBs using glass filled epoxy resins for the substrate are inexpensive and relatively robust, however cost considerations limit the leads on PCBs to relatively thin films. Most PCBs carry current traces which are no more than 125–150 µm thick. Such thin films cannot carry the high currents required of modern power supplies. Thin conductive leads thereby limit current that can be delivered to or from the FETs, attached to the PCB, without generating excessive amounts of heat.

Therefore a problem remains in high current power supplies, in sourcing and sinking large currents but keeping cost low and limiting temperature rise.

SUMMARY

The present disclosure is directed to a package (housing) for a power supply or other circuit involving high electric current, which couples low resistance, high current metallic posts (leads) directly to the current-handling input and output electrodes of the die of the semiconductor devices, which are, e.g. switching transistors (such as FETs). The posts are the pins (external leads) of, e.g. a single-in-line package (SIP), and are held in place by attaching them mechanically to a substrate such as a rigid printed circuit board. The circuit board conventionally provides a substrate for the FETs and supporting circuitry, for example a controller chip which operates the transistors and associated filtering components. The conductive traces of the printed circuit board need not carry high current, as the high current paths are provided instead by the posts. Additional high current connections between the transistors or between the transistors and the posts are relatively thick metallic current "straps" coupled between the transistors and/or posts using conductive epoxy or solder paste. Therefore, according to this invention, high current connections are provided by low resistance, relatively thick, metallic members, while the circuit board carries low current control signals to the transistors. The package thereby improves upon the prior art by avoiding wire bonding or PCB traces to carry high currents.

This approach provides a direct attachment for the input/output contact regions of the power transistors (die) to the leads of a SIP. This allows a small size package, with effective heat exhaustion, because of the thick, low resistance posts and straps used for high current connections. The resulting lower temperature rise reduces mechanical stressing of the components, and gives higher reliability because of reduced thermal cycling. In the exemplary embodiments disclosed herein, the invention is applied to a synchronous buck type of DC/DC converter. However it will be clear to those skilled in the art that the invention can be applied to virtually any circuit using power (high current) semiconductor devices or switches such as bipolar transistors or field effect transistors, and is also suitable for two terminal semiconductor devices.

These and other features of the present invention will be illustrated further by the following detailed description, and the accompanying drawings of the exemplary embodiments.

DETAILED DESCRIPTION

This disclosure is directed to a package in which contact is made to the electrodes of a "bare die" (unpackaged) semiconductor device such as a power transistor (switch), by connecting low resistance, high current conductive posts directly to the current input and output electrodes of the power transistor. The posts are held in place by attaching them mechanically to a printed circuit board or other substrate on which the transistor is also mounted, and are the leads to electrically connect the transistor externally to the package. The circuit board also provides a substrate for supporting circuitry, for example the controller chip which operates the transistor switches. However the traces of the printed circuit board need carry no high current, as high current paths are defined by the posts. Additional high current connections internal to the package, are via relatively thick metallic "straps" coupled to the transistors and posts using, e.g. conductive epoxy or solder paste. Therefore, all high current connections are provided by low resistance, thick, metallic members (posts and straps), while the circuit board itself carries only low power control signals to the transistors.

Figure 1:
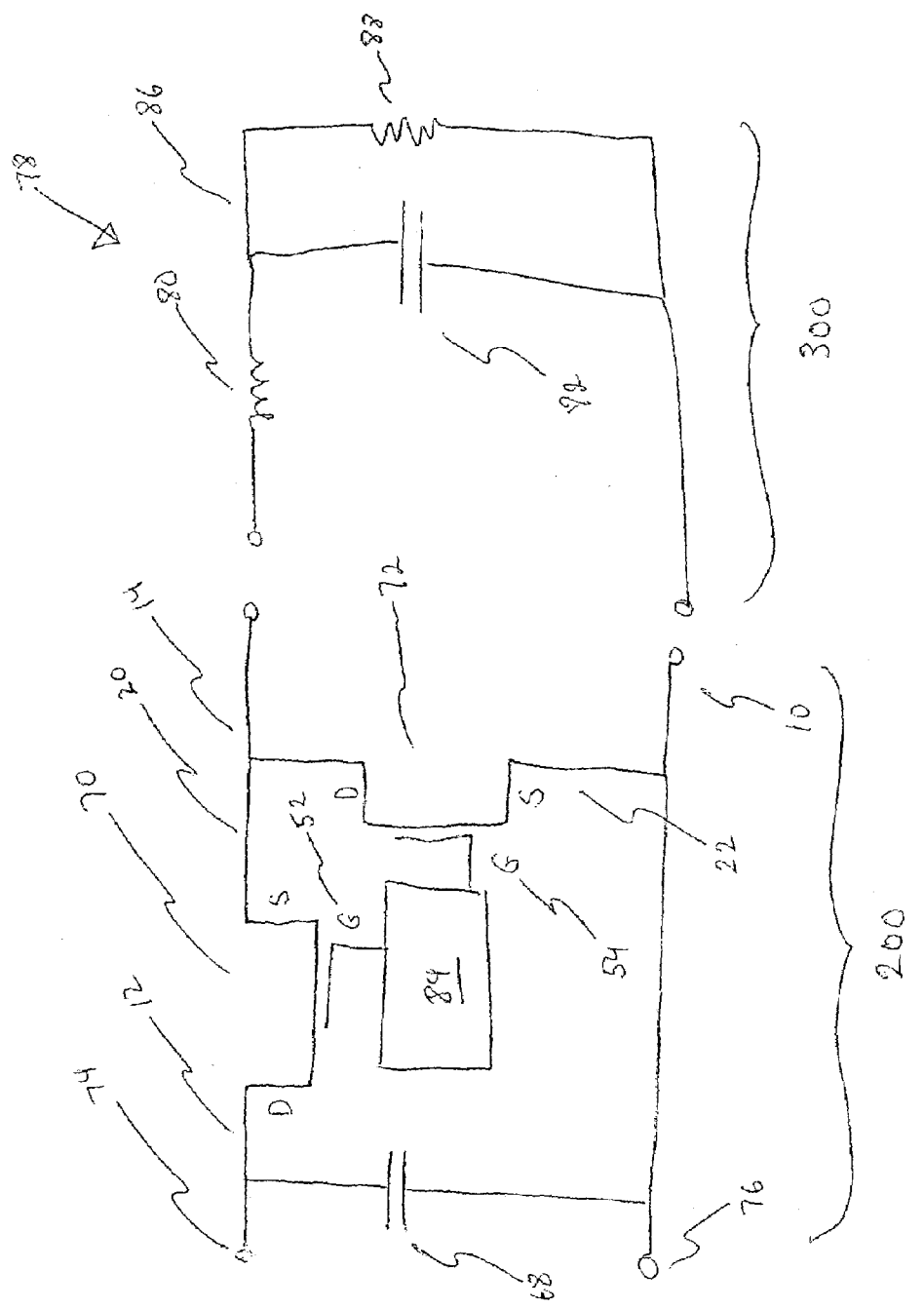
FIG. 1 shows a schematic diagram of a conventional synchronous buck converter circuit, as an exemplary circuit upon which this invention may be practiced.

FIG. 1 is a simplified schematic of a conventional DC/DC converter (power supply) circuit, upon which the invention can be practiced. The figure shows a synchronous buck converter well known in the art that converts an input voltage to a different output voltage. Buck converters provide a DC output voltage from a DC input voltage, at high efficiency, and therefore have found application in powering microprocessors in, for example, personal computers. Such microprocessors requiring about 30A current, are usually powered by a synchronous buck converter, capable of greater than 80% efficiency at full load. The 120V input AC "mains" current is converted to a 12V DC output current using a conventional AC-DC converter. The 12V DC is then buck converted down to the voltage required by the microprocessor.

The synchronous buck converter of FIG. 1 includes two power switches (transistors) 70, 72 coupled across the input voltage terminal 74, with an input filter capacitor 68. The power switches are P- or N-channel field effect transistors (FETs), or bipolar transistors, for example. The voltage switch 70, has its drain terminal (D) coupled to the input terminal 74 and the other switch 72 has its source terminal (S) connected to the ground terminal 76. An output filter 78 typically including an inductor 80 and a capacitor 82, is connected to the node 14 (between switches 70, 72) and ground, as shown. Although the output filter 78 is shown in FIG. 1, it should be clear to those skilled in the art that the components of the output filter, namely inductor 80 and capacitor 82 may be located on a second PCB 300, rather than as part of the power supply assembly, 200. The output filter 78 provides output voltage to a load coupled between the output terminal 86 and ground 76 under the direction of a controller chip 84. The controller 84 controls the switches 70 and 72 via their gate terminals (G) 52 and 54 to connect the output filter 78 to the voltage terminal 74 or to the ground terminal 76, to maintain the output voltage at a predetermined level. In the event that the load output voltage exceeds a reference level, the controller 84 turns off voltage switch 70, and turns on grounded switch 72, allowing inductor 80 to discharge. When the voltage drops to a level below the reference voltage, the controller turns on voltage switch 70 and turns off grounded switch 72, thereby charging inductor 80 and providing current to the output load. This maintains continuous power delivery during the on and off states of switch 70. In one embodiment, the FIG. 1 circuit is located on two separate printed circuit board assemblies 200 and 300, that are electrically connected.

Figure 2:
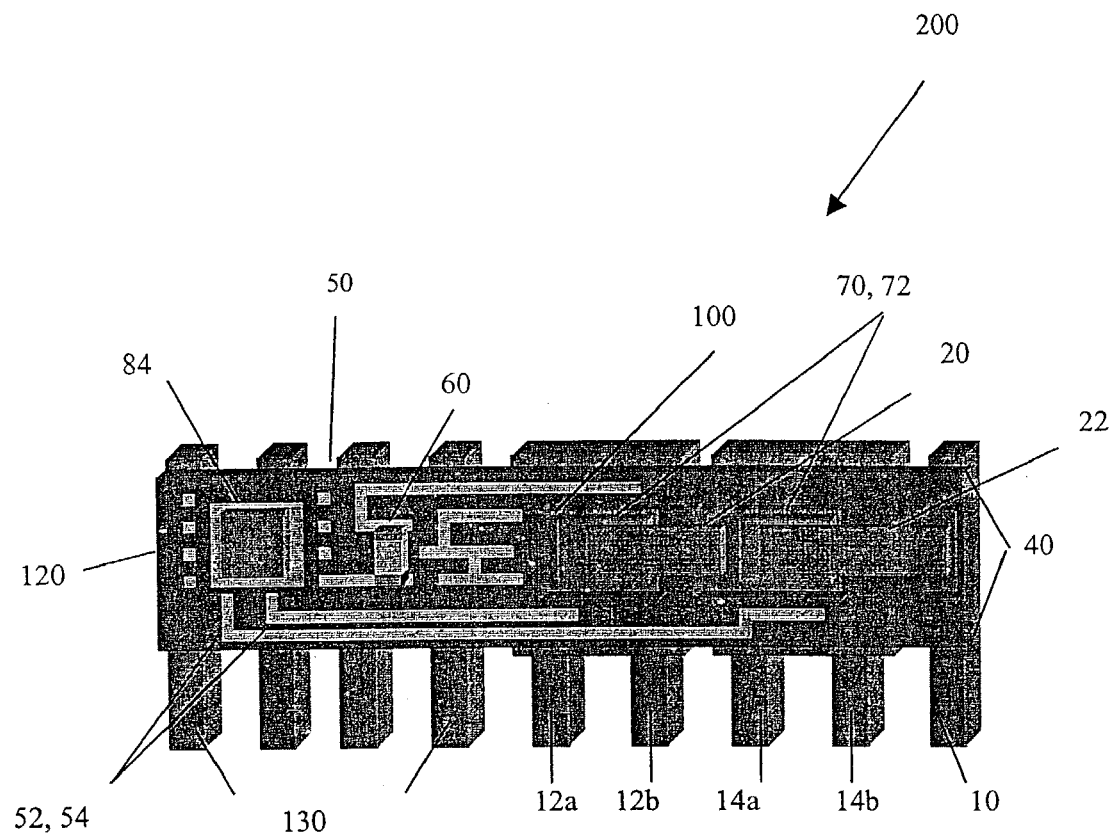
FIG. 2 shows a perspective view of the FIG. 1 synchronous buck DC/DC converter in a single-in-line package (SIP), according to an aspect of this invention.

FIG. 2 shows a diagrammatic illustration of an embodiment of the present invention as applied to the synchronous buck converter circuit of FIG. 1. While a synchronous buck converter is described here, it will be clear to one skilled in the art that the invention can be applied to any circuit (power supply or other) which uses transistor switches or similar semiconductor devices. Such alternative embodiments include, for example, boost converters, buck-boost converters, continuous and discontinuous flyback converters, push-pull converters, and one- and two-transistor forward converters.

A SIP package 200 is, e.g. an industry standard format for small form factor DC/DC power supplies. The dimensions of the package may be 2.5 inches by 0.55 inches by 0.31 inches, for typically 6 to 10A of output current at an output voltage of between 0.6V and 3.3V. Using the assembly disclosed here, output currents as high as 40A to 60A are achieved, using the same form factor SIP package.

According to a first embodiment of the invention, the electrodes of two power switches (FETs) 70 and 72 of the buck converter are electrically connected to a set of, e.g. copper or aluminum posts 10, 12a, 12b and 14a, 14b, using a low resistance junction material such as solder or conductive epoxy. The posts 10, 12a, 12b and 14a, 14b carry the output current, the input current and the source/drain current to the PCB 300 which carries the output filter inductor 80 and capacitor 82 (not shown in FIG. 2). The FETs used in this embodiment are, for example part nos. NA85 FDS6688 for the ground switch 72, and NY85 FDS6694 for the voltage switch (transistor) 70, which are bare die N-channel enhancement mode FETs manufactured by Fairchild Semiconductor Corp. of South Portland, ME. These FETs are die that have one or more source electrodes located on the front side of the die, and the drain electrode located on the opposing back side of the die. Therefore, the posts are attached to the drain electrode on the back side of each die, and the source electrodes are attached to a thick metallic "strap" on the front side of the die. The electrical connections are made directly to the metallization areas on the electrodes of the die.

Because the posts can be made from a relatively thick material, for example stamped or chemically etched copper sheet metal, they can be of any desired thickness, and carry thereby large currents, such as 40–60A at low resistance. The posts are attached mechanically to a conventional laminated printed circuit board 50 (PCB) using a conventional adhesive, at attachment points 40. Holes or relieved areas 100 may be defined in the PCB to provide clearance for the transistors, such that the switches protrude at least in part through the surface of the PCB. The PCB thereby provides structural support for the posts. Also mounted on the PCB is the (unpackaged) controller chip die 84, which is die-attached to the PCB 50 using conventional surface mount techniques. Also included are other components 60, which by way of example, may include capacitors, resistors and inductors 68, 80, 82, 88 as in FIG. 1. In FIG. 2 the smaller parts 60 are shown attached to the PCB, whereas larger parts such as inductor 80 may be mounted directly to the posts, 10, 12 and 14, if not provided on the PCB 300. FIG. 2 shows the assembly 200 before application of the molding compound (plastic), which will conventionally encapsulate the PCB and power switches at final assembly, with the ends of the posts protruding therefrom to serve as leads. The entire assembly 200 can be conventionally mounted to PCB 300 to complete the circuit.

Figure 5:
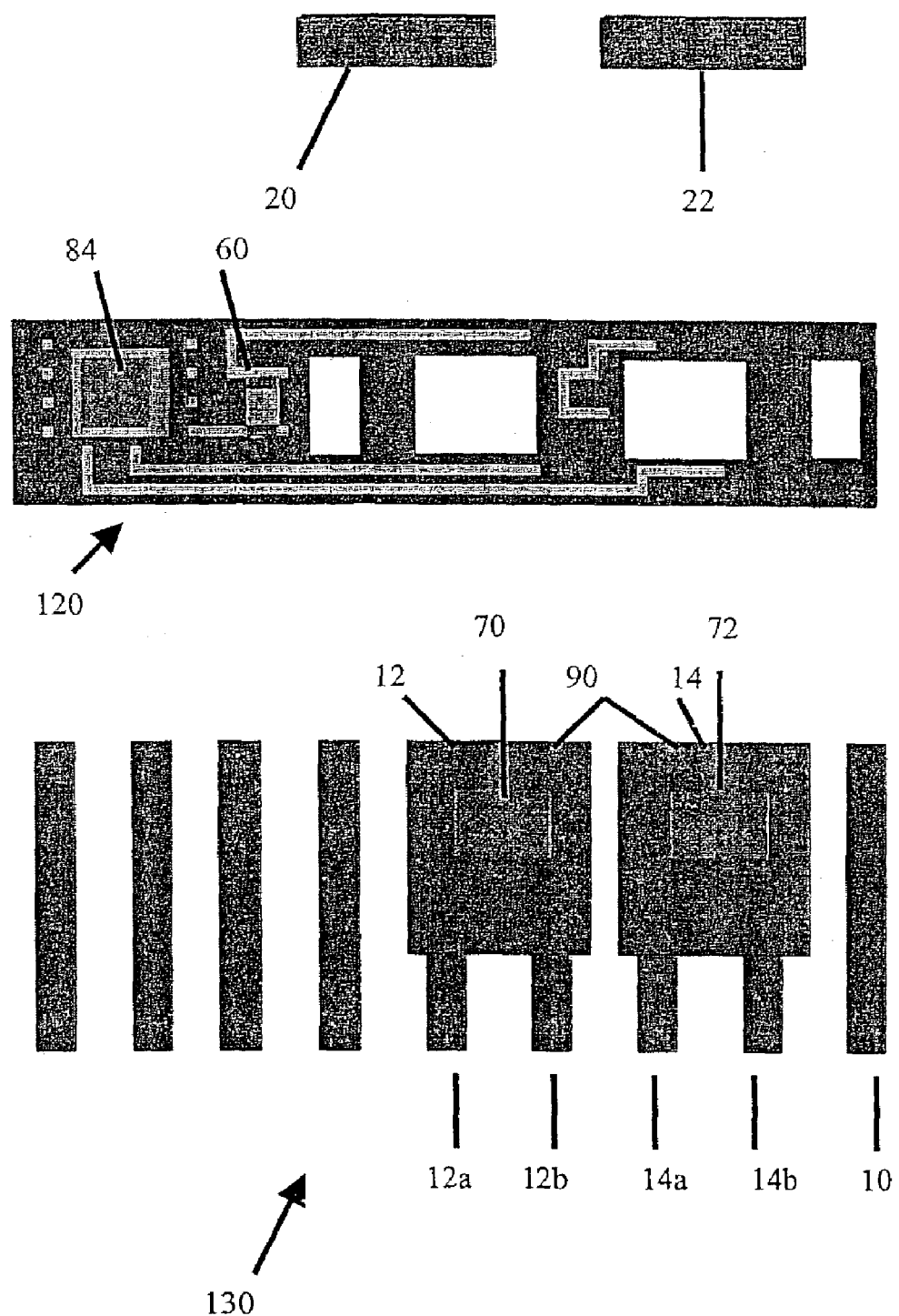
FIG. 5 shows the components of the FIG. 2 synchronous buck converter before final assembly.

Also shown in FIG. 2 (and FIG. 1) are two high current metallic source terminal "straps" 20 and 22. Strap 20 connects the source region contact (electrode) of switch 70 to the drain region contact of switch 72, at source/drain post 14. Strap 22 connects the source region contact of switch 72 to ground via post 10. The straps may be copper straps 20 and 22, which are connected by applying conductive epoxy or solder to the terminal contacts (the source/drain metallization on the die) of the high power switches 70, 72. In an alternative embodiment, the straps may be aluminum, which is ultrasonically bonded to the source and drain electrodes of the switches 70 and 72. The ground switch 72 is mounted on the source/drain post 14, and connected with a copper strap 22 to the ground post 10. If the FETs are fabricated with aluminum as the metallization material, it may be advantageous to first plate the metallization pads with nickel, followed by a precious metal such as gold to prevent oxidation, such that a conductive adhesive or solder may then be used to form the electrical connections to the pads. The figure shows two posts 14a and 14b shorted together by metal attachment points 90 in the rear, as shown in FIG. 5. The metal attachment may be an integral part of the post material, and formed when the posts are stamped or etched. This is done because the size of the FET switch is sufficient to span two posts, and so the posts 14a, 14b are joined to lower overall resistance. The same is true of dual input drain posts 12a and 12b, shown joined together as post 12 in FIG. 5 by attachment point 90. Therefore, all the conductors which carry substantial amounts of current are thick, low resistance posts 10, 12 and 14 or straps 20, 22, and not the traces on the printed circuit board 50. The number of posts may vary depending on current loads and size constraints. The printed circuit board 50 traces are only low current signal interconnects and control lines, for example the control gate lines 52, 54 of the controller chip 84, which provide the control signals to the gate terminals of the switches 70 and 72. The control gate lines are coupled to the gate electrodes of the switches 70 and 72 using conventional techniques such as wire bonding.

Figure 3:
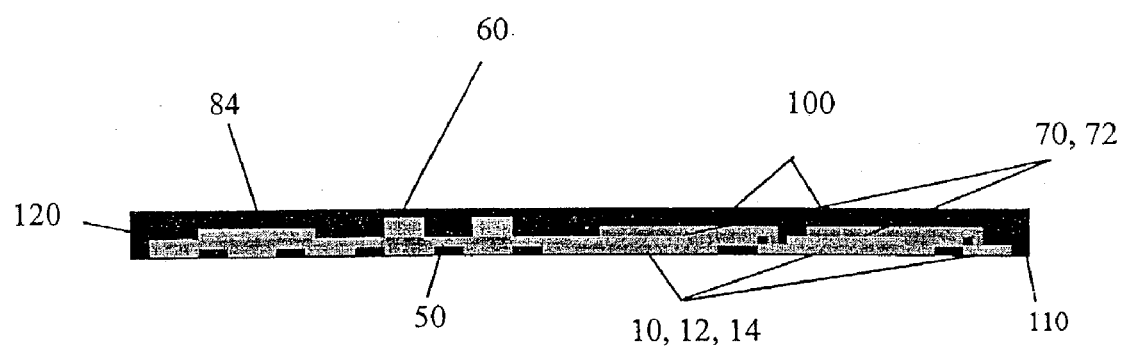
FIG. 3 shows a cut away side view of the FIG. 2 synchronous buck converter in the SIP in a single-sided embodiment, and with a molding compound encapsulating the converter.

FIG. 3 shows the package 200 diagrammatically in a side view cutaway. In this example, the PCB 50 has ICs and FETs mounted only on one side, however it should be clear to those skilled in the art that a conventional double sided PCB could also be used in accordance with this invention. The figure shows the package with the straps 20 and 22, connecting the FET switches 70 and 72 to the posts 10, 12 and 14. The dimensions of the straps will depend, in general, on the geometry of the die being used, but in this embodiment the width of the straps is about 5 mm, and the thickness of the straps is about 0.5 mm. As shown in the figure, the copper straps here have an "L" shape in order to lie flush with the metallized surface of the front of the FET, for example switch 70, and then contact the adjacent metal post, for example post 14. Alternatively, the copper straps can have a gull-wing shape in cross section, which enlarges the contact area with the post, and results in a higher reliability junction. The FET switches 70 and 72, controller chip 84 and PCB 50 are enclosed within a conventional plastic molded encasement body 110 to create the finished package. The distal ends of posts 10, 12, and 14 extend outside the molded body. The finished package 200 is therefore quite compact, and adheres to the SIP specification of less than 2.5 inches by 0.55 inches by 0.31 inches.

Figure 4:
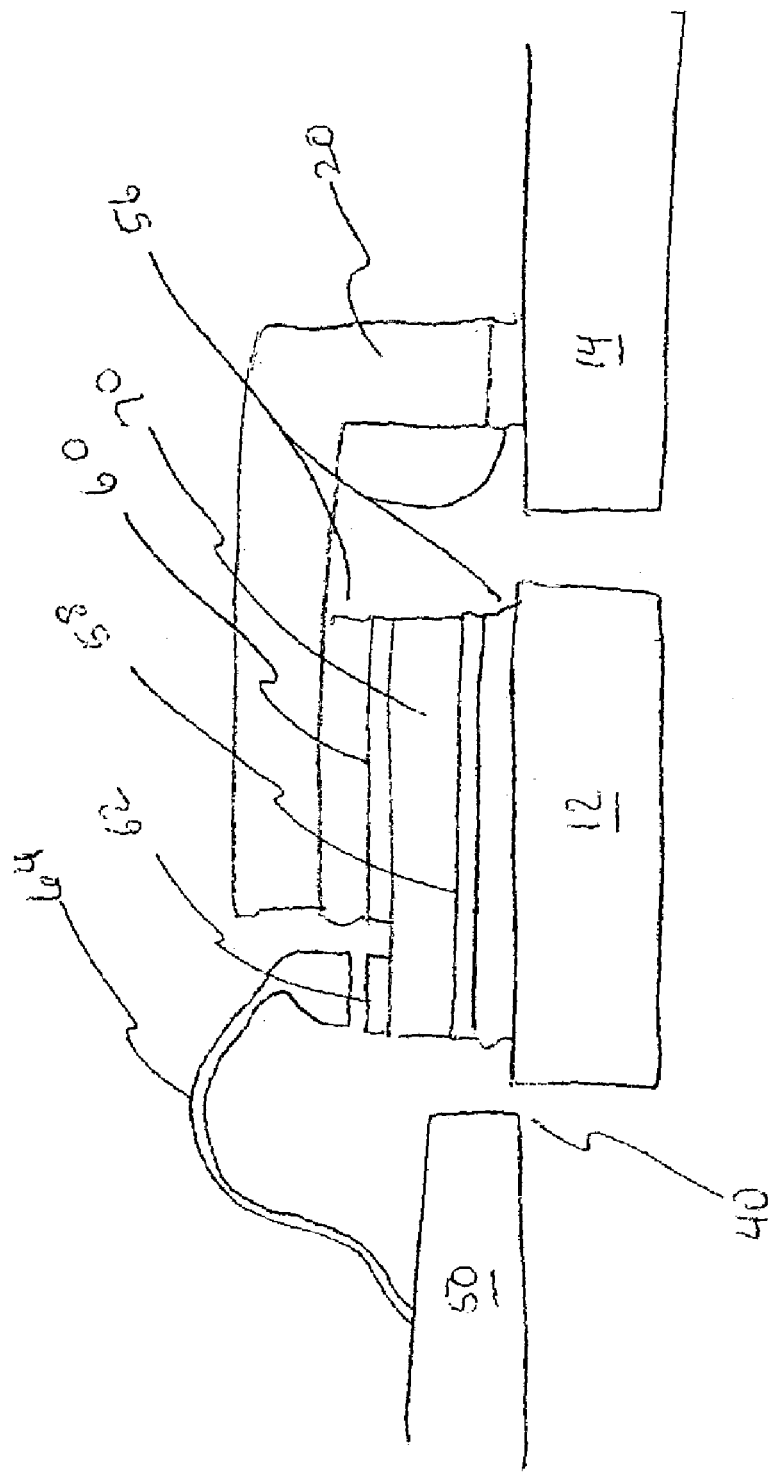
FIG. 4 shows a cross sectional view showing detail of the attachment of an FET to the thick metallic post and copper strap.

FIG. 4 shows in cross section further detail of the mounting of the FET switch 70, for example, to post 12, and connected by copper strap 20 to source/drain post 14. FET 70 is attached by drain electrode metallization layer 58 located on the back side of the FET, to post 12 by solder or conductive epoxy 56. The front side source electrode metallization 60 is attached to the copper strap 20 by solder or conductive epoxy 56. The FET gate electrode pad 62 is also on the front side of FET 70 and is connected to PCB 50 by wire bond 64. PCB 50 is also attached to post 12 at attachment point 40, by any convenient adhesive, for example cyanoacrylate or other suitable attachment means.

FIG. 5 shows an exploded view of the package 200, at an intermediate stage of assembly, wherein the components of the final assembly 200, are visible. The two main components are the PCB sub-assembly 120, and the power switch/post sub-assembly 130.

Figure 6A:
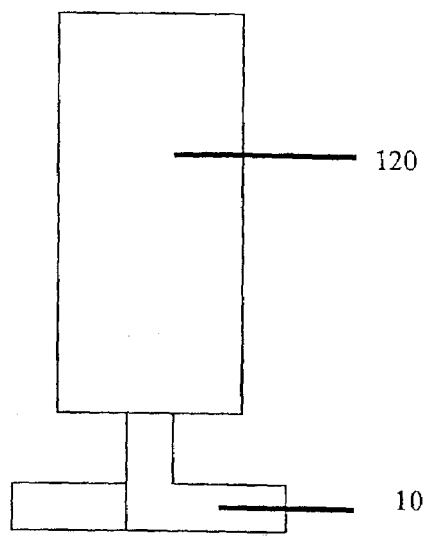
FIG. 6A shows an end view of the present synchronous buck converter in an SMT embodiment.
Figure 6B:
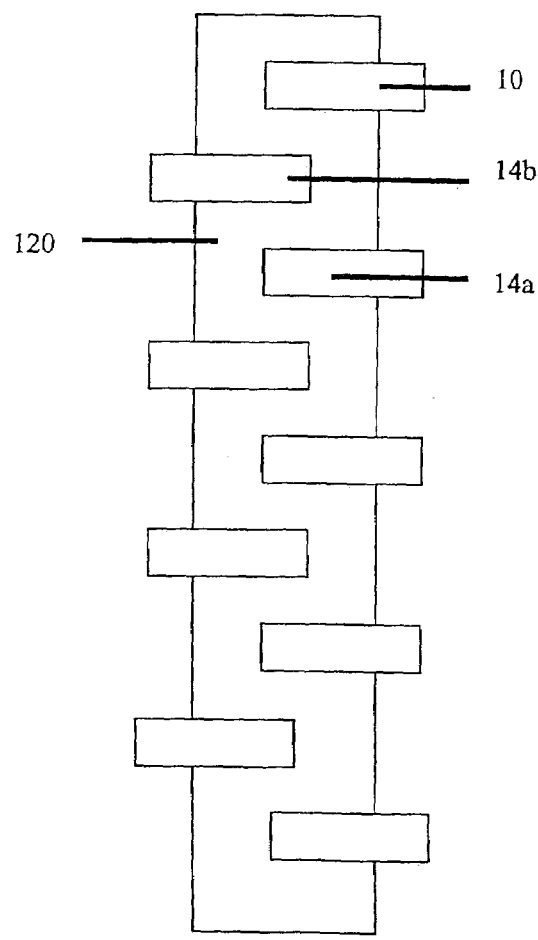
FIG. 6B shows the bottom view of the present synchronous buck converter in the SMT embodiment.

The posts for the SIP package shown in FIG. 5 are straight posts (leads) for mounting in through holes for attachment onto a mating printed circuit board 300 of FIG. 1. However, it will be clear to those skilled in the art that other attachment methodologies may also be used, such as surface mount technology (SMT). For SMT attachment, the posts of the assembly 200 are L-shaped, as shown in the end view of FIG. 6A. The L-shaped posts need not follow the alternating pattern shown in FIG. 6B, but may alternatively be oriented such that, for example, the posts on the ends of the package face one direction, and all other posts face the other.

Figure 7:
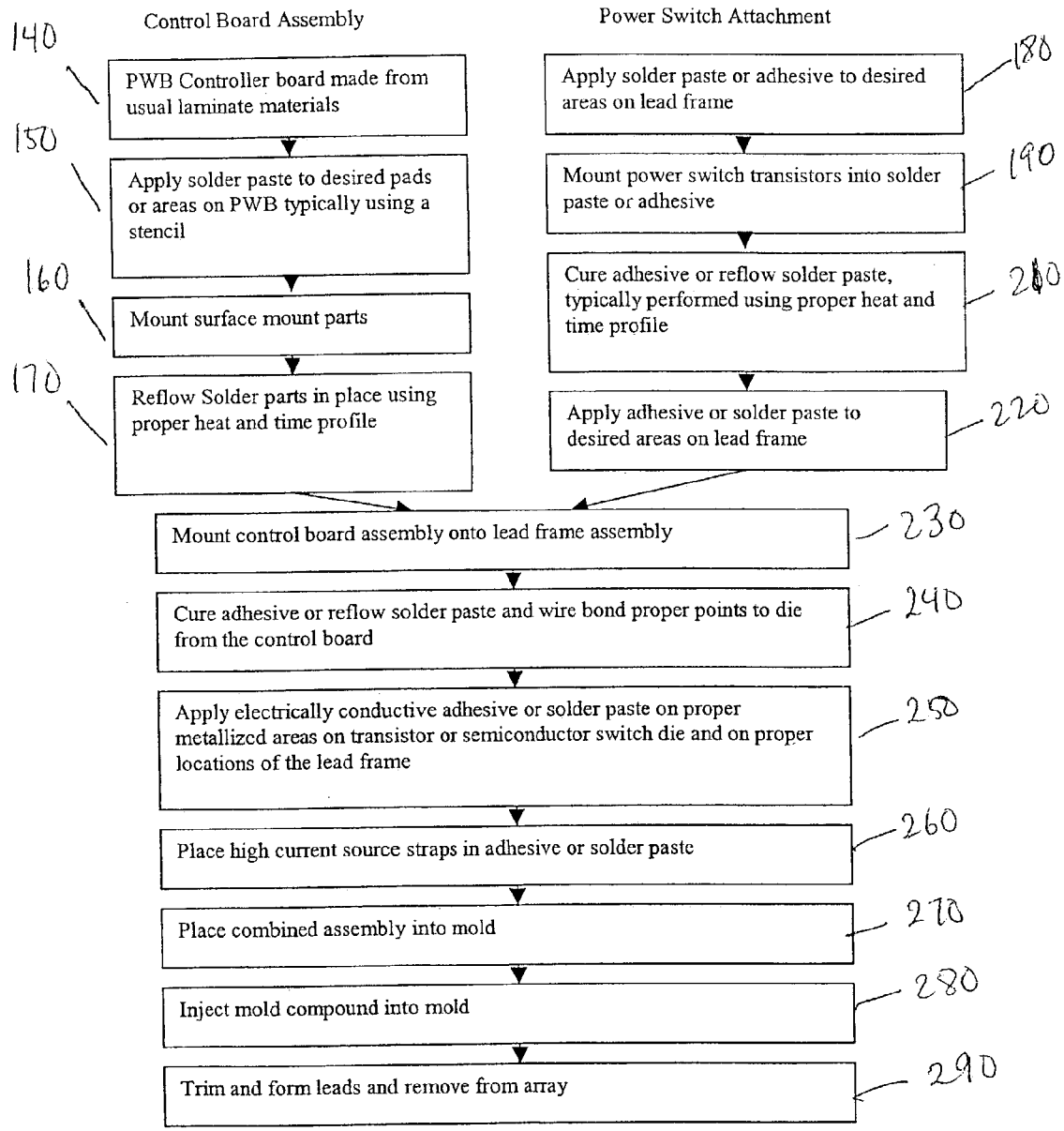
FIG. 7 shows a process for the manufacture of the present synchronous buck converter assembly according to an embodiment of this invention.

The components shown in FIG. 5 can be manufactured according to the process shown in FIG. 7. In the process, two sub-assemblies may be constructed in parallel, before being joined in step 230 of the process. The first sub-assembly is the printed circuit control board sub-assembly 120, shown in FIG. 6, which comprises PCB thin laminate board 50. A suitable material is provided at step 140, which can be for example epoxy glass laminate, bismaleimide triazine (BT) laminate, or Thermagon, manufactured by Thermagon Inc. of Cleveland Ohio, which is a ceramic-filled epoxy polymer, metal based laminate and core material, and is a thermally conductive material for printed circuit board design applications. A solder paste is applied (step 150) to desired areas of the thin laminate PCB 50 by using, for example, a stencil to apply the paste to the desired locations. The stencil pattern is used to provide connection circuitry for the components which will populate the PCB 50. The controller chip 84 is then mounted (step 160), along with any other passive components 60, using surface mount technology, for example. The solder is reflowed (step 170) by baking in an oven to attach the components to the PCB 50 by alloying the solder into conductive junctions, using the proper heat and time parameters recommended by the manufacturer of the solder paste. This completes the construction of the control board assembly 120.

Meanwhile, the power switch/post sub-assembly 130 is constructed, by first providing a post material. The material for the posts can be composed of stamped or chemically etched metal sheets, which may be formed into posts 10, 12 and 14 which are, for example, 0.5 mm to 2 mm thick, and having a similar width. In this exemplary embodiment, the posts are 0.5 mm thick copper. The posts 10, 12 and 14 in one embodiment are all originally connected to a sacrificial bus bar. The bus bar holds posts 10, 12 and 14 in place through the assembly process, and is conventionally removed at the final packaging step 290. (This assembly of the post and bus bar is a lead frame.) The copper posts 10, 12 and 14 are plated with nickel and a thin layer of gold to promote solderability and inhibit oxidation. The nickel layer may be 2.5 µm thick plated in an electroless nickel plating process. The layer of gold may be 100 nm thick, and plated in an immersion ion exchange process.

In step 180, solder paste or conductive adhesive is applied to the desired areas on the posts 10, 12 and 14 which are the attachment points to transistors 70, 72. The transistors 70, 72 are mounted at step 190 to the posts 10, 12 and 14 using, e.g., solder paste or conductive adhesive, to form the power switch/post sub-assembly 130. The adhesive is cured at step 210, or the solder paste is reflowed using the proper heat and time profiles recommended by the manufacturer. Suitable conductive adhesives are manufactured by Ablestick Corporation of Seoul, Korea, for example. Ablestick manufactures a variety of die attach and microcircuit adhesives, such as Ablestick 84-1LMI which may be used in this application. Acceptable solder compounds are manufactured by Cooper Industries of Houston, Tex., Indium Corporation of Utica, New York, and Kester, a business unit of Northrop Grumman in Des Plaines, Ill. Finally, adhesive or solder paste is applied at step 220 to the power switch/post sub-assembly 130 at the intended attachment points 40 for attachment of the control board sub-assembly 120. This adhesive need not be electrically conductive, as it is intended to attach the control board assembly mechanically, rather than electrically. The control board assembly provides structural rigidity for the power switch/post sub-assembly 130.

The power switch/post sub-assembly 130 is attached to the control board sub-assembly 120 at the attachment points 40 formed in step 220, to form the combined assembly 200. The adhesive is cured at step 240 or the solder reflowed, to form the attachments. The control gate signal lines 52, 54 from the PCB 50 is then wire bonded to the control gate electrodes (not shown) on the FETs 70 and 72. The straps 20, 22 are placed by applying, at step 250, e.g. electrically conductive epoxy or solder paste to the properly metallized areas on the power switches 70 and 72 and on the corresponding locations on the posts 10, 12 and 14. The straps 20, 22 have been first pre-treated in a manner similar to that applied to the posts 10, 12 and 14, that is, the (e.g. copper) straps 20, 22 have a thin (2.5 µm) layer of nickel coating followed by a thin (100 nm) layer of gold deposited on their surface, to improve solderability. The 100 nm of gold is deposited over the nickel as an oxidation barrier.

The straps 20, 22 are then placed at step 260 in the adhesive or solder paste. The solder is then melted or the conductive epoxy is cured, to form the connections between the straps 20, 22 and the FET switches 70 and 72. After curing the adhesive or reflowing the solder paste, the combined assembly 200 is complete.

The completed assembly 200 can be conventionally encapsulated by applying a plastic molding compound 110, such as those manufactured by Sumitomo Corporation of Tokyo, Japan, Nitto Denko of Osaka, Japan, or HYSOL® a molding powder which is a registered trademark of Henkel Loctite of Rocky Hill, Conn. The combined assembly 200 is placed at step 270 into a mold, and injection molding compound is injected into the mold in step 280. After the compound has dried and hardened, the assembly 200 can be removed from the mold, and the posts trimmed at step 290 and the assemblies can be singulated (cut apart) if a number of them were fabricated in an array. The bus bar is removed at this point, as the plastic encasement 110 and printed circuit board 50 hold the posts in their proper position.

There are alternative embodiments for the process shown in FIG. 5. For example, the FETs 70 and 72 can be mounted at the same time as the control board assembly 120 is mounted to the posts 10, 12 and 14. This may save assembly steps by reducing the number of adhesive/solder applications and cure/reflow process steps in the process flow. However, it may require more complex tooling to hold each of the components in the proper position, as the posts 10, 12 and 14 have not yet been connected to the circuit board 50. Similarly, the straps 20, 22 may be attached at the same time as the control board assembly 120, with a similar increase in tooling complexity.

The assembly according to the present invention has several advantages. By using low resistance, high current lines to transfer current to and from the high power switches, the heat generated by the package can be reduced, especially compared to prior art using the traces deposited on the circuit board to deliver current. The differential expansion of the various components with temperature can be mitigated by using adhesives which flex, and thereby take up stress. Furthermore, the compact nature of the package reduces the stresses of differential expansion by reducing the largest physical dimension, L. Reducing the physical dimension reduces the stress by the factor $1/L^2$, so that cycling fatigue of the components is reduced. Failures due to stress-related cracks and solder breaks are reduced in the embodiments described above.

Using the package disclosed herein, a single-in-line package (SIP) can be realized that is 2.5 inches by 0.55 inches by 0.31 inches, and outputs 40–60A or more of current at 0.6V to 3.3V output voltage. The embodiment has the further advantages of a small number of parts, reduced assembly costs, and high reliability.

The invention is not limited to the exemplary embodiments described above. For instance, the invention is not limited to copper sheet metal for the post material, nor is the invention limited to a buck converter circuit, but can be applied to any circuit needing to deliver high currents to and from its components. To the extent that any features of the present invention have been explained or described in relation to beliefs or theories, it should be understood that the invention is not bound to any particular belief or theory. Other embodiments and variations are within the scope of the invention, as defined by the appended claims.

What is claimed is:

1. A package for semiconductor devices comprising:
   a plurality of metallic posts attached to a substrate;
   at least one semiconductor die having a first and second current handling electrode;
   at least one metallic strap which couples the first current handling electrode of the semiconductor die to one of the metallic posts; and
   a controller chip on the substrate and electrically coupled to a control electrode of the semiconductor die.

2. A package for semiconductor devices comprising:
   a plurality of metallic posts attached to a substrate;
   at least one semiconductor die having a first and second current handling electrode; and
   at least one metallic strap which couples the first current handling electrode of the semiconductor die to one of the metallic posts, wherein one of the metallic posts carries a supply voltage to the second current handling electrode of the semiconductor die.

3. A package for semiconductor devices comprising:
a plurality of metallic posts attached to a substrate;
at least one semiconductor die having a first and second current handling electrode; and
at least one metallic strap which couples the first current handling electrode of the semiconductor die to one of the metallic posts, wherein one of the metallic posts carries a ground potential to the at least one strap.

4. A package for semiconductor devices comprising:
a plurality of metallic posts attached to a substrate;
at least one semiconductor die having a first and second current handling electrode; and
at least one metallic strap which couples the first current handling electrode of the semiconductor die to one of the metallic posts, wherein one of the metallic posts is coupled to the second current handling electrode of the semiconductor die, and also to a second metallic strap coupled to another semiconductor die.

5. A package for semiconductor devices comprising:
a plurality of metallic posts attached to a substrate;
at least one semiconductor die having a first and second current handling electrode; and
at least one metallic strap which couples the first current handling electrode of the semiconductor die to one of the metallic posts, wherein the metallic posts are about 0.5 mm to about 2.5 mm thick.

6. The package of claim 5, wherein the metallic posts are leads of a single-in-line package.

7. A package for semiconductor devices comprising:
a plurality of metallic posts attached to a substrate;
at least one semiconductor die having a first and second current handling electrode; and
at least one metallic strap which couples the first current handling electrode of the semiconductor die to one of the metallic posts, wherein two or more of the posts are shorted together.

8. The package of claim 5, wherein the posts are L-shaped in cross section.

9. A package for semiconductor devices comprising:
a plurality of metallic posts attached to a substrate;
at least one semiconductor die having a first and second current handling electrode; and
at least one metallic strap which couples the first current handling electrode of the semiconductor die to one of the metallic posts, wherein the posts comprise copper, plated with nickel and gold.

10. The package of claim 5, wherein the semiconductor die comprises an FET.

11. A package for semiconductor devices comprising:
a plurality of metallic posts attached to a substrate;
at least one semiconductor die having a first and second current handling electrode; and
at least one metallic strap which couples the first current handling electrode of the semiconductor die to one of the metallic posts, wherein the straps comprise copper, plated with nickel and gold.

12. A package for semiconductor devices comprising:
a plurality of metallic posts attached to a substrate;
at least one semiconductor die having a first and second current handling electrode; and
at least one metallic strap which couples the first current handling electrode of the semiconductor die to one of the metallic posts, wherein the straps comprise aluminum that is ultrasonically bonded to the first current handling electrode of the semiconductor die.

13. The package of claim 1, wherein the controller chip, the substrate, and the semiconductor die are enclosed in plastic.

14. A package for semiconductor devices comprising:
a plurality of metallic posts attached to a substrate;
at least one semiconductor die having a first and second current handling electrode; and
at least one metallic strap which couples the first current handling electrode of the semiconductor die to one of the metallic posts, wherein the substrate is a thermally conductive laminated ceramic-filled polymer.

15. A power supply comprising:
a plurality of metallic posts, comprising an input post, a ground post and an output post;
a first semiconductor die whose drain electrode is coupled to the input post, and whose source electrode is coupled to a first metallic strap which is coupled to the output post; and
a second semiconductor die whose drain electrode is coupled to the output post; and whose source electrode is coupled to the ground post by a second metallic strap.

16. The power supply of claim 15, further comprising:
a printed circuit board which is mechanically attached to the plurality of metallic posts.

17. The power supply of claim 16, further comprising a controller chip on the printed circuit board, and which outputs a control gate signal which is coupled to a gate electrode of the semiconductor die.

18. The power supply of claim 15, wherein the input post, ground post and output post are leads of a single-in-line package (SIP).

19. The power supply of claim 15, wherein the input post, ground post and output post are leads of surface mount technology (SMT) package.

20. The power supply of claim 15, wherein the first and second straps comprise copper, plated with nickel and gold.

21. The power supply of claim 15, wherein the posts are about 0.5 mm to about 2.5 mm thick and comprise aluminum or copper.

22. The power supply of claim 15, wherein the posts comprise copper, plated with nickel and gold.

23. The power supply of claim 15, further comprising:
an input capacitor coupled between the input post and the ground post.

24. The power supply of claim 15, further comprising:
an inductor coupled to the output post and a load; and
a capacitor coupled between the inductor and the ground post.

25. The power supply of claim 15, wherein the posts are L-shaped in cross section.

26. The power supply of claim 15, wherein the posts have a shape configured to provide a surface mount configuration.

27. The power supply of claim 15, wherein the posts have a gull-wing shape in cross section.

28. The power supply of claim 15, wherein at least one of the metallic posts carries a supply voltage to the drain electrode of at least one of the first semiconductor die and the second semiconductor die.

29. The power supply of claim 15, wherein at least one of the metallic posts carries a ground potential to at least one of the first metallic strap and the second metallic strap.

30. The power supply of claim 15, wherein the metallic posts are about 0.5 mm to about 2.5 mm thick.

* * * * *